United States Patent
Chen et al.

(10) Patent No.: US 6,938,682 B2
(45) Date of Patent: Sep. 6, 2005

(54) HEAT DISSIPATION DEVICE

(75) Inventors: Chun-Chi Chen, Tu-chen (TW); Meng Fu, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/902,457

(22) Filed: Jul. 28, 2004

(65) Prior Publication Data

US 2005/0082041 A1 Apr. 21, 2005

(30) Foreign Application Priority Data

Oct. 18, 2003 (CN) .................................... 201172746 A

(51) Int. Cl.⁷ .............................................. F28D 15/00
(52) U.S. Cl. .......................... 165/104.33; 165/104.21; 165/121; 165/80.3; 361/700; 361/697; 257/715; 174/15.2
(58) Field of Search .................. 165/104.33, 104.21, 165/185, 80.3, 104.26; 361/697, 699, 700; 174/15.2; 257/714–715

(56) References Cited

U.S. PATENT DOCUMENTS

| | | | |
|---|---|---|---|
| 4,204,246 A | | 5/1980 | Arii et al. |
| 5,925,929 A | | 7/1999 | Kuwahara et al. |
| 6,102,110 A | * | 8/2000 | Julien et al. ........... 165/104.33 |
| 6,321,452 B1 | * | 11/2001 | Lin ........................ 29/890.032 |
| 6,382,307 B1 | | 5/2002 | Wang et al. |
| 6,394,175 B1 | * | 5/2002 | Chen et al. ................ 165/80.3 |
| 6,435,266 B1 | | 8/2002 | Wu |
| 6,469,894 B2 | * | 10/2002 | Ubukata ..................... 361/700 |
| 6,542,364 B2 | | 4/2003 | Lai et al. |
| 6,651,734 B1 | * | 11/2003 | Liu ........................... 165/80.3 |
| 6,779,595 B1 | * | 8/2004 | Chiang .................. 165/104.33 |
| 6,796,373 B1 | * | 9/2004 | Li .......................... 165/104.21 |
| 6,830,098 B1 | * | 12/2004 | Todd et al. ............ 165/104.33 |
| 2003/0173061 A1 | * | 9/2003 | Lai et al. .................... 165/80.4 |
| 2004/0035558 A1 | * | 2/2004 | Todd et al. ............. 165/104.26 |
| 2004/0050534 A1 | * | 3/2004 | Malone et al. ............. 165/80.3 |

* cited by examiner

*Primary Examiner*—Terrell Mckinnon
(74) *Attorney, Agent, or Firm*—Wei Te Chung

(57) ABSTRACT

A heat dissipation device includes a base (10), fins (40), two plates (30), a post (50), a pair of heat pipes (20) and a fan (60). The fins are spaced from each other and defines a plurality of air passages therebetween. The plates are positioned at opposite sides of the fins. The post is perpendicularly engaged in central positions of the fins and the base. The post is coplanar with the base at lowest surfaces. The heat pipes have central segments (22) engaged in the base and end segments (24) sandwiched between the plates and the fins. The fan is positioned to the plates and in communication with the air passages.

19 Claims, 3 Drawing Sheets

HEAT DISSIPATION DEVICE

BACKGROUND OF THE INVENTION

1. Field of the Invention

The present invention relates to heat dissipation devices for removing heat from electronic components, and more particularly to a heat pipe type heat dissipation device.

2. Description of Related Art

Conventional heat dissipation devices used for removing heat from electronic components are mostly formed by extrusion of metallic material. Such kind of heat dissipation device commonly comprises a base, and a plurality of fins integrally extending from the base. The fins are relatively thick in comparison with distances defined between each two adjacent fins, due to inherent limitations in extrusion technology. This restricts the number of the fins that can be formed, and a total heat dissipation area that can be provided by the fins. Furthermore, a height of the fins is limited to about 13 times the distance between each two adjacent fins, also due to inherent limitations in extrusion technology.

In order to keep pace with these developments in electronics technology, assembled heat dissipation devices have been gaining in popularity. For example, China Patent No. 2462641Y provides an assembled heat dissipation device having a plurality of uniformly dimensioned individual plate fins evenly stacked together. This heat dissipation device can provide a large total heat dissipation area. However, the fins are connected together only by the attachment of the tabs of each fin in the indents of the adjacent fin. The fins are prone to be disengaged from each other when the heat dissipation device is subjected to shock or vibration during transportation or in operation. Part of or even the entire stack of fins may collapse.

With the continuing boom in electronics technology, numerous modern electronic components such as central processing units (CPUs) of computers can operate at very high speeds and thus generate large amounts of heat. The heat must be efficiently removed from the CPU; otherwise, abnormal operation or damage may result. The conventional heat removal way merely by conduct of heat is increasingly no longer able to adequately remove heat from these contemporary electronic components.

Meanwhile, heat pipes have been generally applied to enhance heat removal efficiency. Commonly, a heat dissipation device has a plurality of small heat pipes perpendicularly inserted into a base and a plurality of spaced fins individually perpendicularly engaged with the heat pipes. However, the engagement of the heat pipes with the base is limited by the thickness of the base. The total contacting area between the heat pipes and the fins is limited by the dimension of the heat pipes. Though the heat pipes inherently have a great heat-transfer capability, the heat dissipation device is not yet facilitated to remove heat from the CPU.

SUMMARY OF THE INVENTION

Accordingly, an object of the present invention is to provide a heat dissipation device which optimizes the heat removal capability of the heat dissipation device.

In order to achieve the object set out above, a heat dissipation device in accordance with a preferred embodiment of the present invention comprises a base, fins, two plates, a post, a pair of heat pipes and a fan. The fins are spaced from each other and defines a plurality of air passages therebetween. The plates are positioned at opposite sides of the fins. The post is perpendicularly engaged in central positions of the fins and the base. The post is coplanar with the base at lowest surfaces. The heat pipes have central segments engaged in the base and end segments sandwiched between the plates and the fins. The fan is positioned to the plates and in communication with the air passages.

Other objects, advantages and novel features of the present invention will become more apparent from the following detailed description when taken in conjunction with the accompanying drawings, in which:

DETAILED DESCRIPTION OF THE INVENTION

Figure 1:
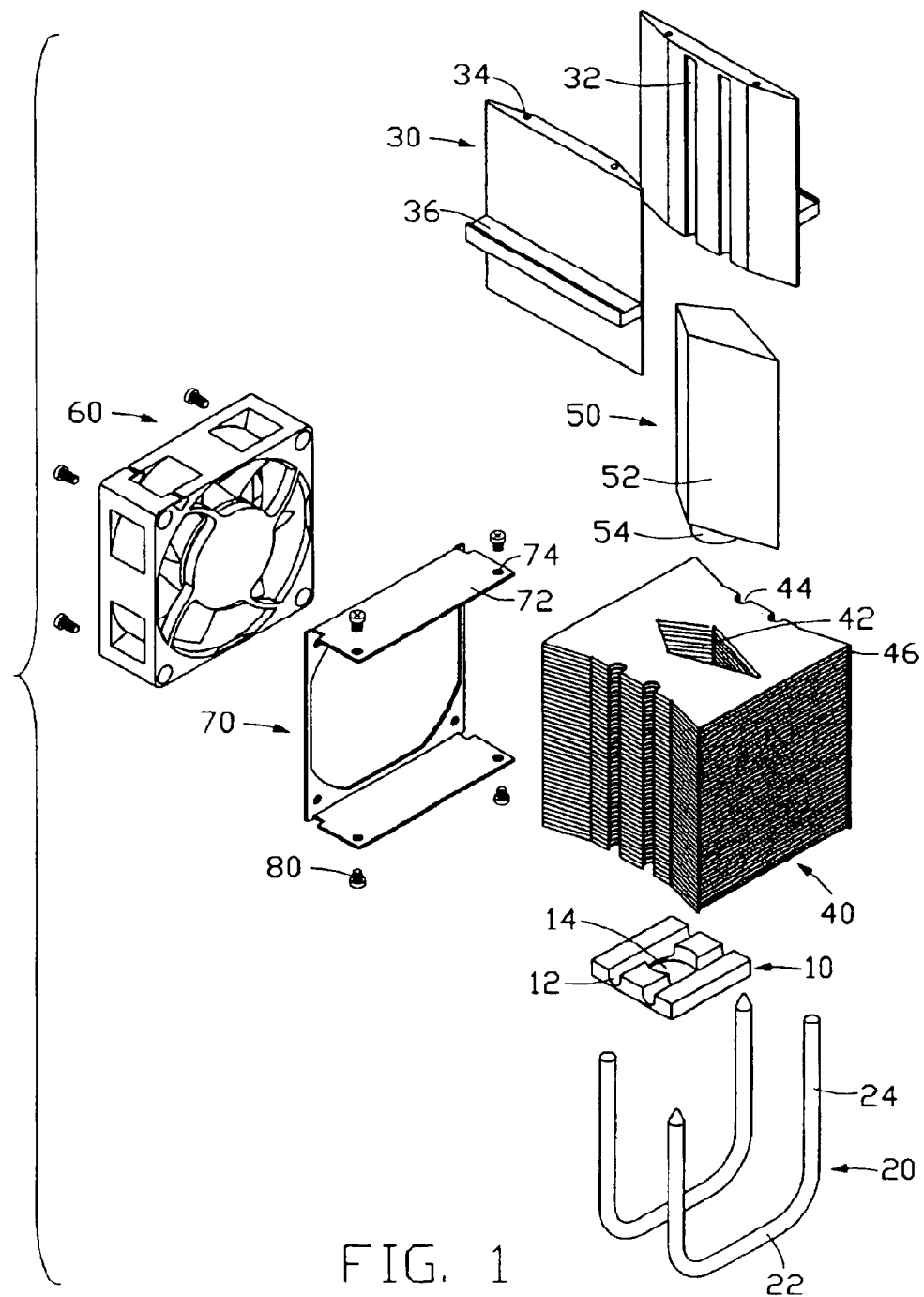
FIG. 1 is an exploded, isometric view of a heat dissipation device in accordance with the preferred embodiment of the present invention.
Figure 2:
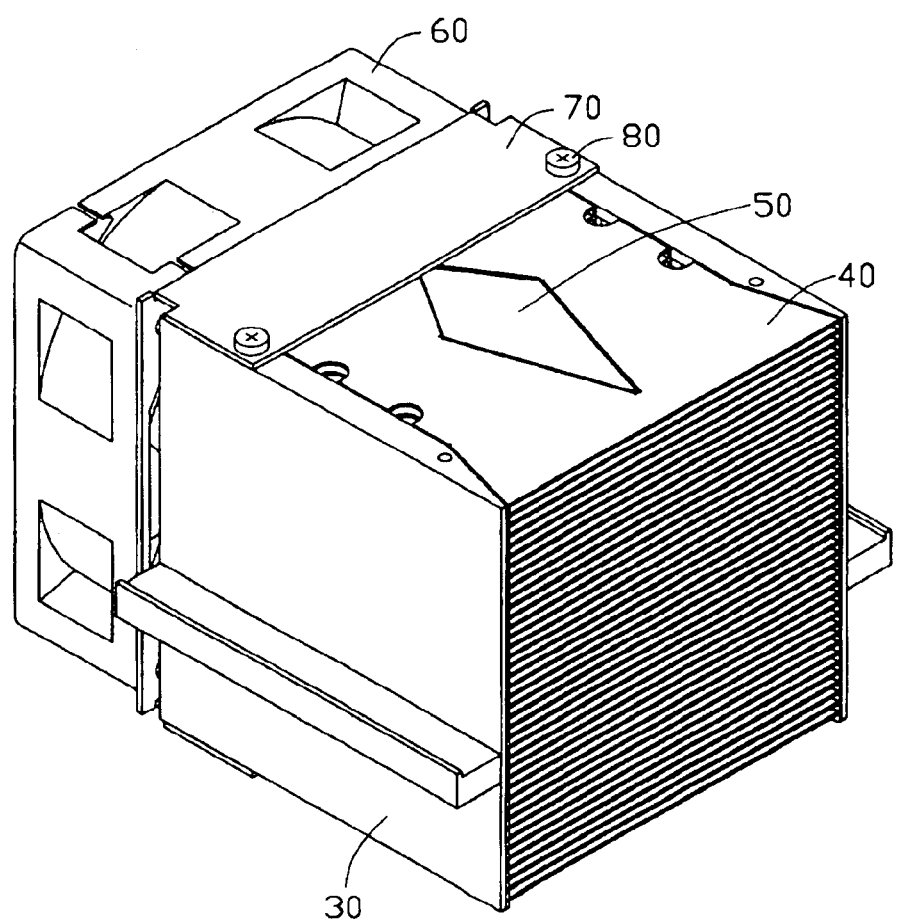
FIG. 2 is an assembled, isometric view of the heat dissipation device of FIG. 1.
Figure 3:
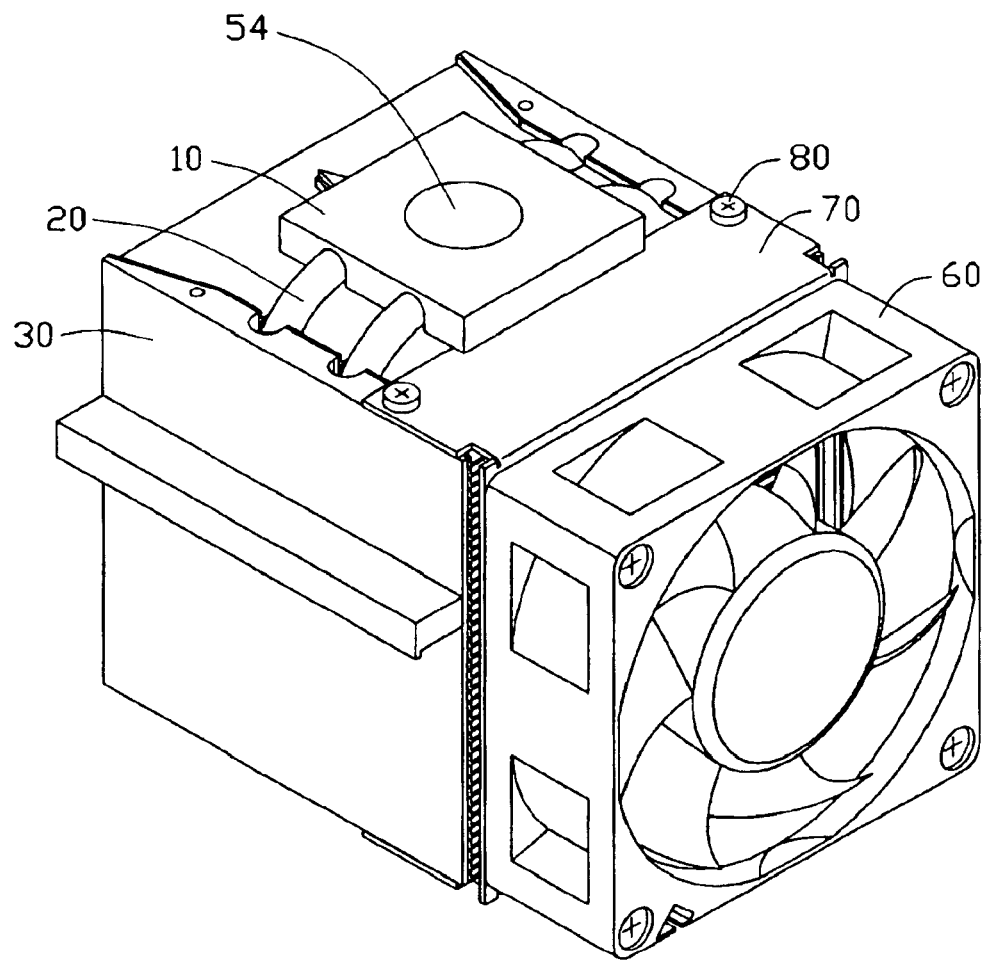
FIG. 3 is similar to FIG. 2, but in a reverse view.

Referring to FIGS. 1–3, a heat dissipation device in accordance with the preferred embodiment of the present invention comprises a base 10, a pair of heat pipes 20, a pair of plates 30, a plurality of fins 40, a post 50, a fan 60 and a fan holder 70 to secure the fan 60. The base 10 and the post 50 both are in thermal contact with an electronic component (not shown) for removing heat therefrom. The plates 30 and the post 50 are perpendicular to the base 10. The fins 40 are parallel to the base 10. Part of the heat on the electronic component can be removed via the base 10, the heat pipes 20 and the plates 30, directly or indirectly to the fins 40. The other heat on the electronic component can be removed via the post 50 directly to the fins 40.

The base 10 is for conducting heat from the electronic component (not shown) to be cooled. A pair of separate grooves 12 is parallelly defined in the base 10. A circle through hole 14 is defined in a substantially central portion of the base 10 between the grooves 12. Each heat pipe 20 has a substantially U-shaped configuration. Each heat pipe 20 comprises a central segment 22 accommodated in the grooves 12 of the base 10, and a pair of parallel end segments 24 which are perpendicular to the central segment 22. The post 50 has a substantially prism body 52 and a cylinder 54 below the prismy body 52. The cylinder 54 is dimensioned smaller than the prismy body 52 and has a thickness substantially equal to that of the base 10. The cylinder 54 is inserted into the through hole 14 of the base 10, and has its bottom surface is coplanar with a bottom surface of the base 10.

Each fin 40 is substantially rectangular, and defines a rhomboidal opening 42 at a central portion thereof. A pair of respective opposite sides of each fin 40 is inwardly concave, and defines a pair of notches 44 therein. Each fin 40 perpendicularly forms a pair of continuous flanges 46 at said opposite sides thereof. When all of the fins 40 are stacked together, the openings 42 thus define a central channel (not labeled) for receiving the body 52 of the post 50 therein. The end segments 24 of the heat pipes 20 are engaged with the flanges 46 in the notches 44. The flanges 46 define intervals between the fins 40.

The plates 30 are positioned to the flanges 46 of the fins 40, and parallel to a longer diagonal of the prismy body 52 of the post 50. Each plate 30 is convex toward the fins 40 in accordance with the dimension of the fins 40. Each plate 30 defines a pair of slots corresponding to the notches 44 of the fins 40, for receiving the end segments 24 of the heat pipes 20 therein. At least one screw hole 34 is defined in respective top and bottom ends of each plate 30. A horizontal shoulder 36 is formed at an outer side of each plate 30 for supporting a clip (not shown) to secure the heat dissipation device to the electronic component.

The fan 60 is mounted to the fan holder 70. The fan holder 70 has a pair of positioning portions 72 extending perpendicularly from opposite sides of the fan holder 70. Outer corners of the positioning portion 72 define holes 74 therein. Screws 80 are inserted into the holes 74 and further engaged within the screw holes 34 of the plates 30, for positioning the fan 60 to a side of the fins 40. At this time, the plates 30, the fan holder 70 and each of the fins 40 are respectively symmetrical to themselves about the longer diagonal of the post 50.

In the present invention, the base 10 and the post 50 can simultaneously remove heat from the electronic component directly or indirectly to the fins 40. In comparison with the heat pipes 20, the plates 30 have a greater thermal engaging area with the fins 40. Thus, the plates 30 of the instant invention can facilitate the heat pipes 20 to transfer heat to the fins 40. The post 50 is a prism; it also has a greater thermal engaging area with the fins 40. There is a rapid heat transfer between the post 50 and the fins 40. In other words, this invention provides two heat passages. The base 10, the heat pipes 20 and the plates 30 can transfer heat to peripheral portions of the fins 40; and the post 50 can transfer heat to a central portions of the fins 40. Under the conditions of two heat passages as above-described, the heat on the fins 40 is evenly distributed. This facilitates to dissipate heat from the fins 40 to ambient air.

Additionally, each fin 40 is inwardly concave at said opposite sides. An air passage (not labeled) is defined between any two adjacent fins 40, which has larger opposite ends than a center area. The post 50 is disposed at central portions of the fins 40, the air flows along the longer diagonal of the prismy body 52. Therefore, the post 50 divides each air passage in two, symmetrical to each other about the longer diagonal of the post 50 and having a similar configuration to the original air passage. This design of the instant invention facilitates air flow among the fins 40.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device comprising:
    a base;
    fins spaced from each other and defining a plurality of air passages therebetween;
    two plates positioned at opposite sides of the fins;
    a post perpendicularly engaged in central positions of the fins and the base, the post being coplanar with the base at lowest surfaces;
    a heat pipe having central portion thereof engaged in the base and opposite end portions sandwiched between the plates and the fins;
    a fan positioned to the plates and being in communication with the air passages.

2. The heat dissipation device of claim 1, wherein the post has a substantially prismy body engaged in the fins.

3. The heat dissipation device of claim 2, wherein the post further has a cylinder below the body engaged in the base.

4. The heat dissipation device of claim 1, wherein the base defines a groove therein, the groove receiving the central portion of the heat pipe therein.

5. The heat dissipation device of claim 1, wherein each of the fins has a pair of opposite side inwardly concave.

6. The heat dissipation device of claim 5, wherein each of the plates is convex toward the fins in accordance with the dimension of the fins.

7. The heat dissipation device of claim 1, wherein each of the fins forms a pair of perpendicular flanges at opposite sides thereof, the plates abutting against the flanges.

8. The heat dissipation device of claim 7, wherein each of the fins defines a notches at respective said opposite sides, and each of the plates defines a slot corresponding to the notches, each of the end portions of the heat pipe received in corresponding notch and slot.

9. The heat dissipation device of claim 7, wherein the flanges define intervals between the fins.

10. The heat dissipation device of claim 1, further comprising a fan holder for holding the fan and screws for securing the fan holder to the plates.

11. The heat dissipation device of claim 10, wherein the fan holder forms a pair of positioning portions extending perpendicularly from opposite sides thereof, through holes being defined in the positioning portions, and screw holes being defined in the plates, the screws inserted through the through holes and further engaged within the screw holes.

12. A heat dissipation device comprising:
    a fin assembly including a plurality of spaced fins arranged in a parallel relation;
    a fan located at one lengthwise end of said fin assembly;
    a post extending through a center portion of the fin assembly, one end of said post receiving heat derived from a heat source; and
    a pair of plates located by two lateral sides of the fin assembly; wherein
    said pair of plates cooperate with said post to form a pair of airflow channel sets, by two sides of the post, each with a narrowed waist section.

13. The heat dissipation device of claim 12, wherein at least one heat pipe is thermally connected between the pair of plates and the end of the post.

14. The heat dissipation device of claim 13, wherein said heat pipe is supportably engaged with a base which contacts both the end of the post and the heat source.

15. The heat dissipation device of claim 12, wherein said end of the post directly mechanically contacts the heat source.

16. The heat dissipation device of claim 12, wherein said post has a diamond-like cross-section.

17. A heat dissipation device comprising:
    a fin assembly including a plurality of spaced fins arranged in a parallel relation;
    a fan located at one lengthwise end of said fin assembly; and
    a post extending through a center portion of the fin assembly, one end of said post directly contacting a heat source; wherein
    said post defines a diamond-like cross-section with thereof an acute angle facing the fan.

18. The dissipation device of claim 17, wherein a heat pipe is located about the end of the post.

19. The dissipation device of claim 18, wherein a base is located about the end of the post, and the heat pipe is embedded in the base.

* * * * *